United States Patent
Daigle et al.

(10) Patent No.: US 12,215,190 B2
(45) Date of Patent: Feb. 4, 2025

(54) SQUARIC ACID-BASED POLYMERS, THEIR MANUFACTURING PROCESSES AND THEIR USES

(71) Applicants: HYDRO-QUÉBEC, Montréal (CA); MURATA MANUFACTURING CO., LTD., Nagaokakyo (JP)

(72) Inventors: Jean-Christophe Daigle, St-Bruno-de-Montarville (CA); Antoine Lafleur-Lambert, Québec (CA); Sylviane Rochon, Saint-Adelphe (CA); Yuichiro Asakawa, Nagaokakyo (JP); Charlotte Mallet, Montreal (CA); Karim Zaghib, Longueuil (CA)

(73) Assignees: HYDRO-QUÉBEC, Montréal (CA); MURATA MANUFACTURING CO., LTD., Nagaokakyo (JP)

( * ) Notice: Subject to any disclaimer, the term of this patent is extended or adjusted under 35 U.S.C. 154(b) by 1118 days.

(21) Appl. No.: 16/982,178

(22) PCT Filed: Apr. 30, 2019

(86) PCT No.: PCT/CA2019/050564
§ 371 (c)(1),
(2) Date: Sep. 18, 2020

(87) PCT Pub. No.: WO2019/210411
PCT Pub. Date: Nov. 7, 2019

(65) Prior Publication Data
US 2021/0032403 A1    Feb. 4, 2021

Related U.S. Application Data

(60) Provisional application No. 62/700,554, filed on Jul. 19, 2018, provisional application No. 62/664,611, filed on Apr. 30, 2018.

(51) Int. Cl.
| | | |
|---|---|---|
| C08G 65/00 | (2006.01) | |
| C08G 65/40 | (2006.01) | |
| G02F 1/1516 | (2019.01) | |
| H01B 1/12 | (2006.01) | |
| H01M 10/0565 | (2010.01) | |
| H10K 85/10 | (2023.01) | |
| H01M 10/0525 | (2010.01) | |

(52) U.S. Cl.
CPC ....... *C08G 65/005* (2013.01); *C08G 65/4087* (2013.01); *G02F 1/15165* (2019.01); *H01B 1/124* (2013.01); *H01M 10/0565* (2013.01); *H10K 85/111* (2023.02); *H10K 85/151* (2023.02); *C08G 2261/316* (2013.01); *C08G 2261/3223* (2013.01); *C08G 2261/3342* (2013.01); *H01M 10/0525* (2013.01); *H01M 2300/0082* (2013.01)

(58) Field of Classification Search
USPC ........................................................ 528/425
See application file for complete search history.

(56) References Cited

U.S. PATENT DOCUMENTS

| | | | |
|---|---|---|---|
| 5,212,283 A | 5/1993 | St. Clair | |
| 5,380,807 A * | 1/1995 | Havinga | ............... H01B 1/127 |
| | | | 528/229 |
| 2003/0118877 A1 | 6/2003 | Armand et al. | |
| 2019/0242842 A1 | 8/2019 | Lu et al. | |

FOREIGN PATENT DOCUMENTS

| | | |
|---|---|---|
| CN | 1438254 | 8/2005 |
| CN | 102516504 | 6/2012 |
| CN | 108535333 A | 9/2018 |
| CN | 108776157 A | 11/2018 |
| DE | 3428843 A1 | 2/1985 |
| EP | 0551938 A1 | 7/1993 |
| EP | 0603939 A2 | 6/1994 |
| JP | 2010-195791 | 8/2013 |
| WO | 99/028984 | 6/1999 |
| WO | 2010028726 A1 | 3/2010 |

OTHER PUBLICATIONS

Mohammad Shahid Ullah et al. Cinchona Squaramide-Based Chiral Polymers as Highly Efficient Catalysts in Asymmetric Michael Addition Reaction, ACS Omega 2018 3 (4), 4573-4582 (Year: 2018).*
International Search Report (PCT/ISA/210) issued on Jul. 16, 2019, by the Canadian Patent Office as the International Searching Authority for International Application No. PCT/CA2019/050564.
Neuse et al., "Poly(squaryl amides)", Polymer, vol. 15, Jun. 1974, pp. 339-345.
Written Opinion (PCT/ISA/237) issued on Jul. 16, 2019, by the Canadian Patent Office as the International Searching Authority for International Application No. PCT/CA2019/050564.
Armand, M. et al., "Building better batteries" Nature, vol. 451, Feb. 2008, pp. 652-657.
Bao, Z. et al., "Synthesis of Conjugated Polymer by the Stille Coupling Reaction" Chemistry of materials vol. 5. No. 1, (1993), pp. 2-3.
Littke, A. F. et al., "Versatile Catalysts for the Suzuki Cross-Coupling of Arylboronic Acids with Aryl and Vinyl Halides and Triflates under Mild Conditions" Journal of the American Chemical Society, vol. 122, No. 17, (2000), pp. 4020-4028.
Meng, B. et al., "Phosphonated Conjugated Polymers for Polymer Solar Cells with NonHalogenated Solvent Process" Polymer Chemistry, vol. 6. No.5, 2015, 9 pages.

(Continued)

*Primary Examiner* — Terressa Boykin
(74) *Attorney, Agent, or Firm* — Womble Bond Dickinson (US) LLP

(57) ABSTRACT

Squaric acid-based polymers and their use in electrode materials and/or electrolyte compositions, as well as their production processes are described herein. Also described are electrode materials, electrodes, electrolyte compositions, electrochemical cells, electrochemical accumulators, and optoelectronic devices comprising the polymers and their uses.

13 Claims, 5 Drawing Sheets

(56) References Cited

OTHER PUBLICATIONS

Muench, S. et al., "Polymer-Based Organic Batteries" Chemical Reviews, vol. 116, No. 16, 2016, pp. 9438-9484.
Page, Z. A. et al., "Rapid, facile synthesis of conjugated polymer zwitterions in ionic liquids" Chemical Science, vol. 5, (2014), pp. 2368-2373.
Patnaik, S. G. et al., "BIAN Based Electroactive Polymer with Defined Active Centers as Metal-Free Electrocatalysts for Oxygen Reduction Reaction (ORR) in Aqueous and Nonaqueous Media" ACS Applied Energy Materials, vol. 1. No.3, (2018), pp. 1183-1190.
Peng, C. et al., "Reversible multi-electron redox chemistry of IT-conjugated N-containing heteroaromatic molecule-based organic cathodes" Nature Energy, vol. 2, (2017), 9 pages.
Rostami, A. et al., "N, N0-Diarylsquaramides: General, High-Yielding Synthesis and Applications in Colorimetric Anion Sensing" The Journal of organic chemistry, vol. 75, No. 12, 2010, pp. 3983-3992.
Schmidt, J. et al., "Conjugated Microporous Polymer Networks via Yamamoto Polymerization" Macromolecules, vol. 42, No. 13, (2009), pp. 4426-4429.
Talens, V. S. et al., "Shape modulation of squaramide-based supramolecular polymer nanoparticles" Polymer Chemistry, vol. 10, No. 23, (2019), pp. 3146-3153.
Tanimoto A. et al.,"Comparison of UV-Vis Changes Observed in Deprotonation of 2-Heptylbenzimidazole, 2-Heptyl4,7-diphenylbenzimidazole, and Poly(2-heptylbenzimidazole-4,7-diyl)" Bulletin of the Chemical Society of Japan, vol. 77, No. 3, (2004), pp. 597-598.
Xu, F. et al., "Anthraquinone-based polyimide cathodes for sodium secondary batteries" Electrochemistry Communications, vol. 60, (2015), pp. 117-120.
Yokoyama, A. et al., "Chain-Growth Polymerization for the Synthesis of Polyfluorene via Suzuki-Miyaura Coupling Reaction from an Externally Added Initiator Unit" Journal of the American Chemical Society, vol. 129, No. 23, (2007), pp. 7236-7237.
Office Action in Japanese Application No. 2020-556790, mailing date Aug. 8, 2023.
Rostami, Ali et al., Structure-Activity Relationships for Anion-Responsive Poly(squaramides): Support for an Analyte-Induced Noncovalent Polymer Cross-Linking Mechanism, Macromolecules, 2013, vol. 46, p. 6439-6450.
Huo, Er Fu et al., Synthesis and characterization of novel conjugated polymers based on 3-cyclobutene-1,2-dione moiety, Chinese Chemical Letters, 2011, vol. 22, p. 1326-1330.
Jeong, Jae Kyun et al., Synthesis and optical properties of poly(phenylenevinylene) modified with 3,4-bis (phenylene)-3-cyclobutene-1,2-dione moiety, Polymer Bulletin, 1999, vol. 42, p. 559-565.
Extended European Search Report dated Feb. 9, 2022, issued by the European Patent Office in corresponding European Application No. 19796298.8-1102, (9 pages).
Green, b. r et al. "Polyamides derived from squaric acid" Polymer, vol. 14, May 1973, 2 pages.
Jeong, J. K. et al."A novel n-conjugated polymer : poly(3,4-bis(phenylene )-3-cyclobutene-1,2-dione)" Polymer Bulletin, vol. 42, 1999, pp. 183-190.
Ajayaghosh, A. "Donor-acceptor type low band gap polymers: polysquaraines and related systems" Chem. Soc. Rev., 2003, vol. 32, pp. 181-191.
Notice of Hearing for Indian Patent Application No. 202017039836 mailed Oct. 24, 2024.
Itoh et al., "Solid polymer electrolytes based on squaric acid structure", Ionics (2008) 14:1-6; Published Dec. 19, 2007 (https://doi.org/10.1007/s11581-007-0187-7).

\* cited by examiner

SQUARIC ACID-BASED POLYMERS, THEIR MANUFACTURING PROCESSES AND THEIR USES

RELATED APPLICATIONS

This application claims priority under applicable laws to U.S. provisional application No. 62/664,611 filed on Apr. 30, 2018, and U.S. provisional application No. 62/700,554 filed on Jul. 19, 2018, the contents of which are incorporated herein by reference in their entirety for all purposes.

TECHNICAL FIELD

The technical field generally relates to polymers comprising monomeric units derived from squaric acid, their methods of production and their use in electrochemical cells, for instance, in organic polymer-based electrode materials and/or in polymer electrolytes.

BACKGROUND

Up until recently, the replacement of inorganic intercalation compounds by organic polymer-based electrode materials in lithium ion batteries was not considered a promising alternative; partly because most organic polymer-based electrode materials achieved lithium insertion at low voltage (below 4 V) (see (a) Muench, S. et al., *Chemical Reviews* 116.16 (2016): 9438-9484; (b) Peng, C. et al., *Nature Energy* 2.7 (2017): 17074; and (c) Xu, F. et al., *Electrochemistry Communications* 60 (2015): 117-120), which hampers the development of high-energy and high-power rechargeable batteries. Moreover, a good electrode material needs to be ionically and electronically conductive (see Peng, C. et al., above).

The use of organic active materials in electrodes could reduce the environmental footprint of batteries given that the raw materials used are taken from renewable resources (Armand, M. and Tarascon, J-M., *Nature* 451.7179 (2008): 652). These materials may further be used with different ionic species such as sodium, lithium, magnesium, etc.

Accordingly, there is a need for such alternative organic polymer-based electrode materials demonstrating improved properties such lithium insertion at higher voltage.

SUMMARY

According to a first aspect, the present technology relates to a polymer of Formula I:

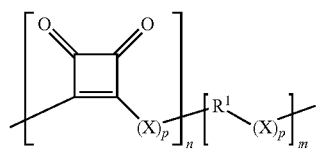

Formula I wherein,
n and m are integers representing the number of each monomeric units within the polymer, n≥2, m≥0;
X is independently in each occurrence, selected from an oxygen atom, a sulfur atom and an amine group ($NR^x$);
p is an integer representing the number of X groups in each monomeric unit, and p is 0 or 1;

$R^1$ is an optionally substituted conjugated non-aromatic cyclic group, such as a quinone group, an optionally substituted aromatic or partially aromatic organic group, or combination thereof in a polycyclic group; and $R^x$ is a hydrogen atom or an optionally substituted alkyl.

According to another aspect, the present technology relates to the polymer as herein defined, for use in an element of an electrochemical cell, in the electrode material and/or in the electrolyte composition.

According to another aspect, the present technology relates to a process for producing the polymer as herein defined, comprising the following steps:

(a) Reacting Monomeric Units of Formulae II and III:

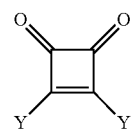

Formula II

Formula III wherein,

X and $R^1$ are as herein defined;

Y is, independently and in each occurrence, selected from a halogen atom, a hydroxyl group, an amine group and a lower alkoxy group; and q is an integer representing the number of each nucleophilic groups within the second monomeric unit and is at least 2; and (b) Isolating the Polymer Produced in Step (a).

In one embodiment, Y is independently a chlorine atom, bromine atom, iodine atom, amine group, hydroxyl group or lower alkoxy group in each occurrence and, for example, the monomeric unit of Formula II is selected from 3,4-dihydroxy-3-cyclobutene-1,2-dione, 3,4-dimethoxy-3-cyclobutene-1,2-dione, 3,4-diethoxy-3-cyclobutene-1,2-dione, 3,4-diisopropoxy-3-cyclobutene-1,2-dione, 3,4-dibutoxy-3-cyclobutene-1,2-dione, 3,4-diamino-3-cyclobutene-1,2-dione, 3,4-dichloro-3-cyclobutene-1,2-dione, 3,4-dibromo-3-cyclobutene-1,2-dione and 3,4-diiodo-3-cyclobutene-1,2-dione. In another embodiment, step (a) is carried out in the presence of an organic base. For example, the organic base comprises a tertiary amine and it is, for example, triethylamine, 2,6-lutidine or pyridine, preferably pyridine.

In another embodiment, step (a) is carried out in the presence of a Lewis acid. For example, the Lewis acid is selected from the group consisting boron trifluoride etherate ($BF_3 \cdot OEt_2$), tin tetrachloride ($SnCl_4$), zinc chloride ($ZnCl_2$) and metal trifluoromethanesulfonates (triflates), preferably zinc trifluoromethanesulfonate (zinc triflate).

In another embodiment, step (a) is carried out in the presence of a solvent and step (b) further comprises elimination of the organic polar aprotic solvent by evaporation.

In another embodiment, the polymer is produced by a polycondensation reaction.

According to another aspect, the present technology relates to a process for producing the polymer as herein defined, comprising the following steps:

(a) Reacting Monomeric Units of Formulae II and IV:

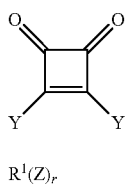

Formula II

Formula IV

R¹(Z)<sub>r</sub> wherein,
R¹ are as herein defined;
Y is a leaving group is independently in each occurrence selected from a chlorine atom, a bromine atom and an iodine atom;
Z is independently and, in each occurrence, selected from the group consisting of a chlorine atom, a bromine atom, an iodine atom, a boronic acid, a boronic acid ester and a trialkyltin group; and
r is an integer representing the number of Z within the monomeric unit of Formula IV and is at least 2; and
(b) Isolating the Polymer Produced in Step (a).

In another embodiment, step (a) further comprises a step of reacting the monomeric units of Formula II with magnesium thereby forming a Grignard reagent in situ before addition of the monomeric unit of Formula IV.

In another embodiment, step (a) is carried out in the presence of a catalyst. For example, the catalyst comprises a transition metal, a compound comprising a transition metal or a coordination complex comprising a transition metal. For instance, the transition metal is selected from the group consisting of Ni, Pd, Co, Fe, Cr, Cu and Mn, preferably, Ni or Pd. For instance, the catalyst may further comprise a trialkylphosphine or triphenylphosphine (PPh₃), tetrahydrofuran (THF), 2,2'-bipyridine (bpy), copper(I) iodide (CuI) or potassium fluoride (KF). In some instances, the reaction may proceed in an ionic liquid without an additional catalyst, for instance when Z is a boronic ester.

According to another aspect, the present technology relates to an electrode material comprising a polymer as herein defined. For instance, the electrode material is a positive electrode material and comprises an electrochemically active material and optionally a binder or optionally an electronically conductive material, or a combination thereof. For example, the polymer is the binder or the electrochemically active material. Alternatively, the polymer is grafted on the electrochemically active material. For instance, both the electrochemically active material and the binder comprise said polymer.

In another embodiment, the electrode material further comprises a transition metal oxide. For example, the transition metal is selected from the group consisting of titanium (Ti), manganese (Mn) and cobalt (Co).

According to another aspect, the present technology relates to a positive electrode comprising the electrode material as herein defined on a current collector.

According to another aspect, the present technology relates to an electrolyte composition comprising a polymer as herein defined and a salt. For instance, the electrolyte is a solid polymer electrolyte (SPE) or a gel electrolyte.

According to a further aspect, the present technology relates to an electrochemical cell comprising a negative electrode, a positive electrode and an electrolyte, wherein at least one of the positive electrode and electrolyte comprises a polymer as herein defined.

According to a further aspect, the present technology relates to an electrochemical cell comprising a negative electrode, a positive electrode and an electrolyte, wherein the electrolyte is as herein defined.

According to a further aspect, the present technology relates to a battery comprising at least one electrochemical cell as herein defined.

According to yet a further aspect, the present technology relates to the polymer as herein defined, for use in a polymer-based optoelectronic device. For instance, the polymer-based optoelectronic device is selected from the group consisting of electrochromic devices (ECDs), photochromic devices, organic light-emitting diodes (OLEDs) and solar cells.

DETAILED DESCRIPTION

Figure 1:
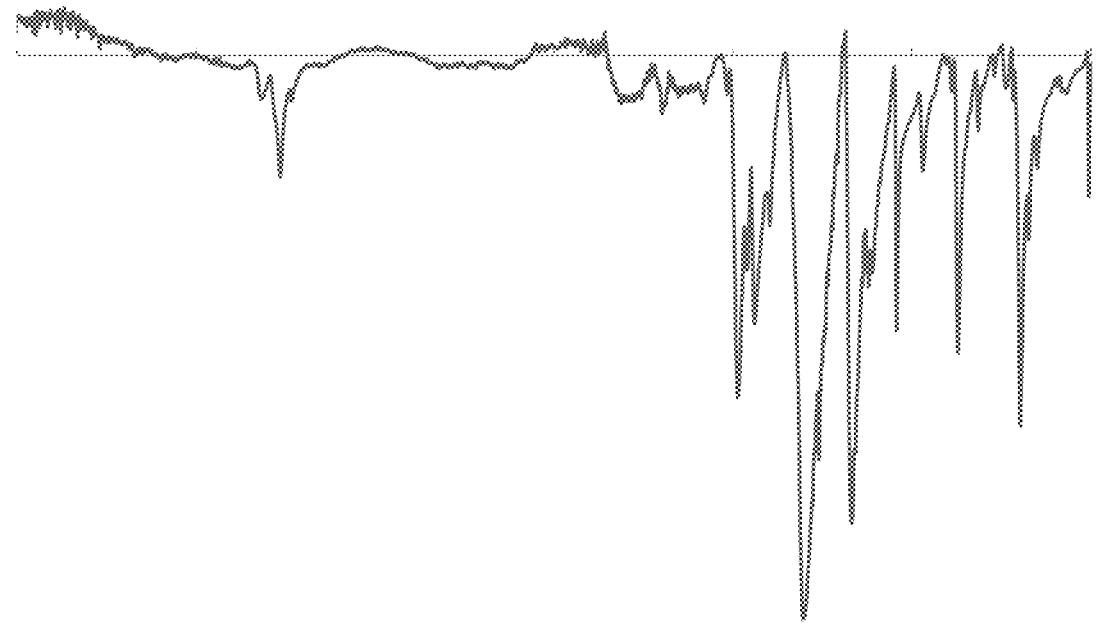
FIG. 1 displays an attenuated total reflectance Fourier transform infrared spectrum (ATR-FTIR) of a copolymer according to one embodiment, as described in Example 2(e).

The following detailed description and examples are illustrative and should not be interpreted as further limiting the scope of the invention.

All technical and scientific terms and expressions used herein have the same definitions as those commonly understood by the person skilled in the art when relating to the present technology. The definition of some terms and expressions used herein is nevertheless provided below for clarity purposes.

When the term "approximately" or its equivalent term "about" are used herein, it means approximately or in the region of, and around. When the terms "approximately" or "about" are used in relation to a numerical value, it modifies it; for example, it could mean above and below its nominal value by a variation of 10%. This term may also take into account the probability of random errors in experimental measurements or rounding.

For more clarity, the expression "monomeric units derived from" and equivalent expressions as used herein will refer to polymer repeat units, which result from a polymerizable monomer after its polymerization.

The chemical structures described herein are drawn according to conventional standards. Also, when an atom, such as a carbon atom as drawn, seems to include an incomplete valency, then the valency is assumed to be satisfied by one or more hydrogen atoms even if they are not necessarily explicitly drawn.

The expression "leaving group" as used herein refers to a group capable of being displaced with its bonding electrons by a nucleophile in a chemical reaction. Examples of representative leaving groups include halogen, alkoxy, tosylates, iodide, bromide, chloride, and the like.

The term "alkyl" as used herein refers to saturated hydrocarbons having from one to twelve carbon atoms, including linear or branched alkyl groups. Examples of alkyl groups include, without limitation, methyl, ethyl, propyl, butyl, pentyl, hexyl, isopropyl, tert-butyl, sec-butyl, isobutyl, and the like. When the alkyl group is located between two functional groups, then the term "alkyl" also encompasses alkylene groups such as methylene, ethylene, propylene, and the like. The term "lower alkyl" designated an alkyl group having from 1 to 6 carbon atoms.

The term "alkoxy" as used herein refers to an alkyl group having an oxygen atom attached thereto. Representative alkoxy groups include groups having 1 to about 12 carbon atoms.

Examples of alkoxy groups include methoxy, ethoxy, isopropyloxy, propoxy, isopropoxy, butoxy, iso-butoxy, tert-butoxy, pentoxy groups and the like. The term "lower alkoxy" designates an alkoxy group having from 1 to 6 carbon atoms.

The expression "aromatic group" is intended to include delocalized conjugated π systems including a number of π delocalized electrons that is equal to 4n+2 π-electrons. The contributing atoms may be arranged in one or more rings. Representative aromatic groups include five and six-membered carbon single-rings. The aromatic group may include one or a plurality of fused benzene rings; for example, benzene, naphthalene, anthracene, and the like. The expression "aromatic group" also comprises aromatic groups comprising one or more heteroatoms such as sulfur, oxygen and nitrogen atoms. The aromatic groups may also be referred to as "heteroaromatic groups" when at least one heteroatom is present. The aromatic ring may be further substituted at one or more ring positions with, for example, a hydroxyl, an amine or the like.

The term "quinone" as used herein refers to cyclic conjugated groups derived from aromatics comprising at least two carbonyl groups (i.e., a dione). These compounds can be viewed as having two C=O groups in which each carbon is part of the cyclic ring structure in a fully conjugated structure. Representative quinones include 1,2-benzoquinones, 1,4-benzoquinones, naphthoquinones, anthraquinones, and the like.

Each quinone group may be further substituted or part of a larger group, e.g. a polycyclic group.

The expression "polycyclic groups" used herein refers to an organic group including at least two cycles linked together by a covalent bond or by sharing at least two cycle atoms (fused rings).

The expression "optionally substituted" as used herein refers to a functional group other than a hydrogen atom which may not negatively interfere with the preparation of the polymer. Examples of such groups will depend on the polymerization conditions and may include groups such as lower alkyl, lower alkoxy, nitrile, fluorine atom, chlorine atom, nitrile, $C_3$-$C_6$cylcoalkyl, $C_3$-$C_6$heterocylcoalkyl, amides, amines, sulfones, sulfonamides, silyls, etc. Alkyls, alkoxys, cycloalkyls, and heterocycloalkyls may be further substituted, for instance as halogenated lower alkyl (e.g. $CF_3$) or halogenated lower alkoxy (e.g. $OCF_3$).

The present technology relates to polymers or copolymers comprising monomeric units derived from squaric acid such as poly(squaryl amide) (see Neuse, E. W. et al., Polymer 15.6 (1974): 339-345) and poly(squaryl ester). For example, such a polymer is intended for use in electrochemical cells. For example, the polymer is for use in an electrode material or as part of an electrolyte composition; for example, a solid or gel polymer electrolyte. Such a polymer could be used as cathode electrochemically active material in an organic Li-ion battery. This polymer allows for battery cycling at high voltage (higher than 3.8 V). Moreover the polymer is electronically and ionically conductive. The polymerization step is done at relatively low cost and is easy to scale-up. The polymer can be designed by selecting the monomers used in copolymerization with squaric acid. This versatility allows for a tunability of the reaction's voltage.

According to a first aspect, the present technology relates to a polymer of Formula I:

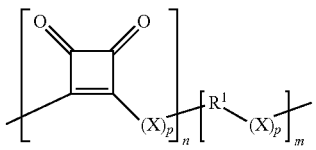

Formula I wherein, n and m are integers representing the number of each monomeric units within the polymer, n≥2, m≥0;

X is independently in each occurrence, selected from an oxygen atom, a sulfur atom and an amine group ($NR^x$);

p=0 or 1;

$R^1$ is an optionally substituted conjugated non-aromatic cyclic group, such as a quinone group, an optionally substituted aromatic or partially aromatic organic group, or a combination thereof in a polycyclic group; and $R^x$ is a hydrogen atom or an optionally substituted alkyl group.

For instance, the aromatic or partially aromatic organic group is a cyclic or a polycyclic aromatic or partially aromatic organic group. The monocyclic or polycyclic aromatic or partially aromatic organic group may be, for instance, derived from one or a plurality of fused benzene rings or from one or a plurality of 5 or 6-membered fused rings or combinations thereof. The monocyclic or polycyclic aromatic or partially aromatic organic group may be, for instance, a heterocyclic group, e.g. heteroaromatic group. Alternatively, the partially aromatic organic group comprises a quinone moiety.

For instance, the monocyclic or polycyclic aromatic or partially aromatic organic group is derived from benzene, naphthalene, anthracene, thiophene, thienopyrroledione, benzothiophene, benzothiadiazole, 3,4-ethylenedioxythiophene, carbazole, dithiopheneanthanthrone, dithiophenediketopyrrolopyrrole, isoindigo or indigo.

For instance, when $R^1$ is a heterocyclic group, then each heterocyclic ring may comprise from 1 to 3 heteroatoms selected from a nitrogen atom, a sulfur atom and an oxygen atom, preferably a nitrogen atom or a sulfur atom. The heterocyclic group comprises at least one aromatic or heteroaromatic group.

For instance, when $R^1$ is a substituted group, then said group is substituted with one or more alkyl group, alkoxy group, nitrile group, hydroxyl group, halogen atom, or with a protecting group when attached to a heteroatom such as a nitrogen atom.

For instance, when $R^x$ is a substituted alkyl group, then said alkyl group may be substituted with a crosslinkable moiety.

In one example, m is 0 and the polymer of Formula I is a squaric acid-based homopolymer. In another example, m is different from 0 and the polymer of Formula I is a copolymer, for instance, an alternate copolymer.

In some of the polymers herein described, p is different from 0 and X is an oxygen atom in all instances, i.e. a polyester polymer. Alternatively, p is different from 0 and X is an amine group in all instances, i.e. a polyamide polymer. In other instances, p is 0 and X is absent.

Other examples of the polymer of Formula I wherein n is greater than 2, then more than 2, or more than 3 squaric-acid containing monomers or chains of monomers may be attached to $R^1$, i.e. $R^1$ may be linked to 1, 2, 3 or more squaric acid monomeric units through X groups or directly.

For instance, the polymer of Formula I is either a homopolymer or a copolymer prepared from monomeric units derived from Formula II. The polymer is thus prepared at least by reacting monomeric units derived from a squaric acid of Formula II:

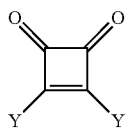

Formula II wherein,
Y is, independently and in each occurrence, selected from a halogen atom, a hydroxyl group, an amine group, and a lower alkoxy group.

For instance, the Y is selected from the group consisting of chlorine, bromine, and iodine atoms, hydroxyl group, amine group, and a lower alkoxy group. In another example, Y is a leaving group selected from chlorides and bromides, preferably a chloride.

Non-limiting examples of monomeric units derived from squaric acid of Formula II include 3,4-dihydroxy-3-cyclobutene-1,2-dione, 3,4-dimethoxy-3-cyclobutene-1,2-dione, 3,4-diethoxy-3-cyclobutene-1,2-dione, 3,4-diisopropoxy-3-cyclobutene-1,2-dione, 3,4-dibutoxy-3-cyclobutene-1,2-dione, 3,4-diamino-3-cyclobutene-1,2-dione, 3,4-dichloro-3-cyclobutene-1,2-dione, 3,4-dibromo-3-cyclobutene-1,2-dione and 3,4-diiodo-3-cyclobutene-1,2-dione. In one variant of interest, the monomeric unit derived from squaric acid of Formula II is 3,4-dichloro-3-cyclobutene-1,2-dione.

In one aspect, the polymer is a copolymer prepared by reacting a monomeric unit of Formula II above and a second monomeric unit of Formula III:

$R^1(XH)_q$  Formula III wherein,
X and $R^1$ are as herein defined and q is an integer representing the number of each nucleophilic groups (XH) within the second monomeric unit and is at least 2.

The second monomeric unit of Formula III is thus a multifunctional nucleophilic reactant having at least two nucleophilic groups (XH). In one variant of interest, the nucleophilic group XH may be either an alcohol, a thiol, or a primary amine group ($NH_2$).

Non-limiting examples of the second monomeric unit of Formula III include p-phenylenediamine (PPD), benzene-1,4-diol, 5,8-dihydroxy-1,4-naphthoquinone, 5,6-dihydroxycyclohex-5-ene-1,2,3,4-tetrone, tetrahydroxy-1,4-benzoquinone, 1,4-diamino-2,3-dihydroanthraquinone and 4,5-dihydroxycyclopentenetrione. For example, the second monomeric unit of Formula III is benzene-1,4-diol or 1,4-diamino-2,3-dihydroanthraquinone.

Examples of second monomeric units of Formula III comprise the compounds of Formulae III(a) to III(g):

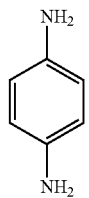

Formula III(a)

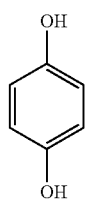

Formula III(b)

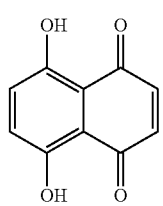

Formula III(c)

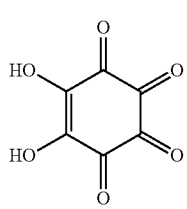

Formula III(d)

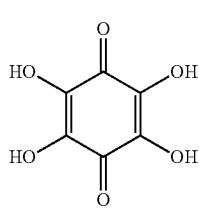

Formula III(e)

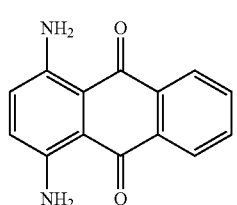

Formula III(f)

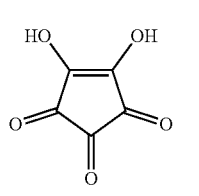

Formula III(g)

Alternatively, the polymer is a copolymer prepared by reacting a monomeric unit of Formula II and a second monomeric unit of Formula IV as defined hereinbelow.

$R^1(Z)_r$  Formula IV wherein,
$R^1$ is as herein defined and Z is, independently in each occurrence, selected from the group consisting of a chlorine atom, a bromine atom, an iodine atom, a boronic acid, a boronic acid ester and a trialkyltin group, preferably a bromine atom and r is an integer representing the number of Z within Formula IV and is at least 2.

For instance, Z is a halogen atom selected from a chlorine atom, a bromine atom, and an iodine atom. In another example, Z is selected from B(OH)$_2$, B(Oalkyl)$_2$, and a cyclic boronic acid ester (e.g. a pinacol boronic acid ester). In a further example, Z is a trialkyltin group such as tri-n-butyltin.

Non-limiting examples of second monomeric units of Formula IV comprise compounds of Formulae IV(a) to IV(j):

Formula IV(a)
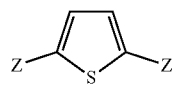

Formula IV(b)
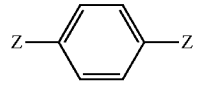

Formula IV(c)
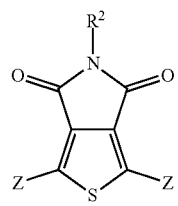

Formula IV(d)
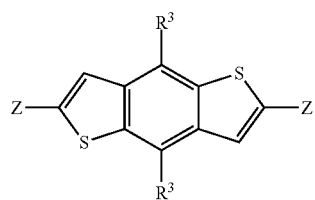

Formula IV(e)
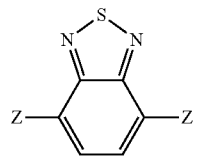

Formula IV(f)
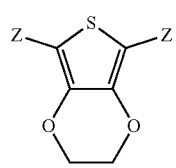

Formula IV(g)
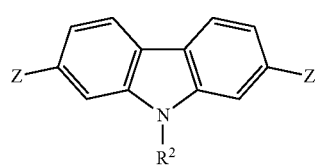

Formula IV(h)
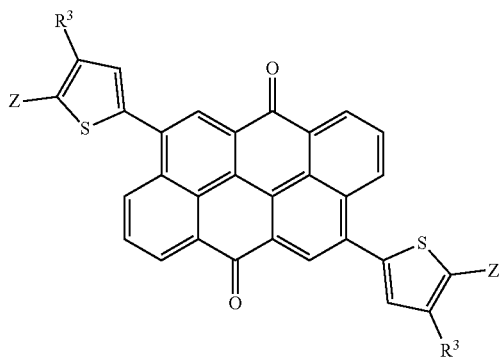

Formula IV(i)
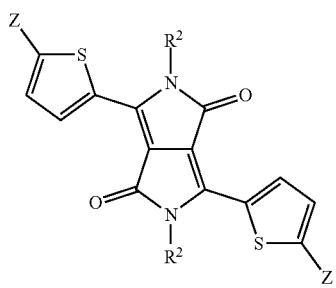

Formula IV(j)
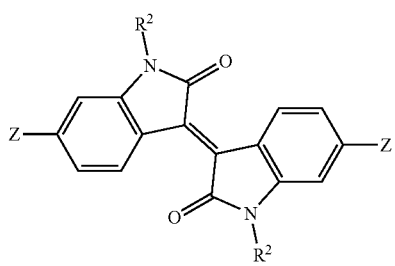

wherein,

Z is as herein defined;

R$^2$ is an amine protecting group; and

R$^3$ is a substituent independently and in each occurrence selected from an alkyl group, an alkoxy group, a nitrile group, a hydroxyl group and a halogen atom, preferably a C$_{6-7}$ alkyl. Alternatively, R$^3$ is a hydrogen atom.

For instance, R$^2$ is tert-butoxycarbonyle (BOC), carbobenzyloxy (CBz), p-methoxybenzyl (PMB) or benzyl (Bn), acetyl (Ac), benzoyl (Bz), preferably R$^2$ is BOC.

Non-limiting examples of second monomeric units of Formula IV may also comprise the compounds of Formulae IV(k) to IV(o):

Formula IV(k)
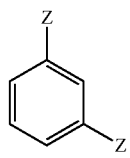

-continued

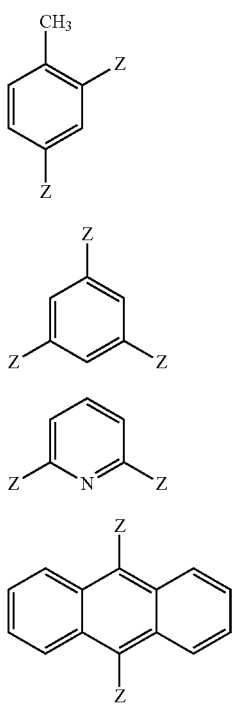

Formula IV(l)

Formula IV(m)

Formula IV(n)

Formula IV(o)

wherein Z is as herein defined.

Where the polymer is a copolymer, said copolymer may, for instance, be an alternating copolymer, a random copolymer or a block copolymer. The copolymer may be linear or branched (e.g. star, comb, etc.). In one variant of interest, the copolymer is an alternating copolymer.

According to another aspect, the present technology also relates to processes for producing the polymer as herein defined. Polymerization of the monomers, may be accomplished by any known procedures. For instance, when the polymer forms a homopolymer, the monomeric units derived from squaric acid may be linked together by a nucleophile moiety, i.e. an oxygen atom or an amine group (NH).

The polymerization of the monomers may be accomplished by any known procedures. For instance, by polycondensation. Where the polymer is a copolymer, the polymerization occurs between the repeated monomeric units derived from squaric acid of Formula II and monomeric units of Formula III. When the polymer is a copolymer, it may be prepared by a polymerization process as illustrated in Scheme 1:

Scheme 1

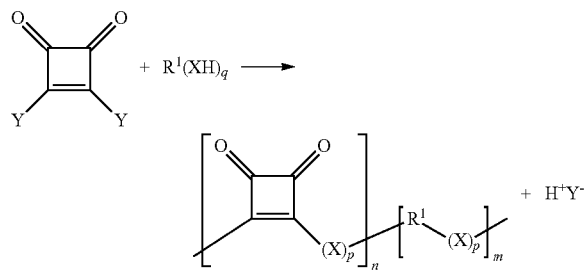

wherein,
Y, $R^1$, X, q, n, and m are as herein defined; and p is 1.

Where the polymer is a homopolymer, the polymerization occurs between monomeric units derived from the squaric acid of Formula II. The homopolymer may be prepared by a polymerization process as illustrated in Schemes 2a or 2b:

Scheme 2 a)

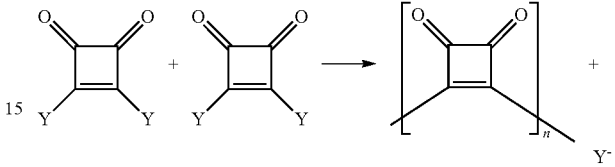

b)

According to one example, the polycondensation is carried out in the presence of an organic base added to trap the condensed molecules ($H^+Y^-$) or any resulting acid released during the polycondensation reaction. In one example, the organic base is an organic base comprising a tertiary amine. Non-limiting examples of organic bases comprising a tertiary amine include triethylamine, 2,6-lutidine and pyridine. For example, the organic base comprises a tertiary amine is pyridine.

According to one example, the polycondensation is carried out in the presence of an organic polar aprotic solvent. For example, the organic polar aprotic solvent is selected from dimethylformamide (DMF), dimethyl sulfoxide (DMSO) and the like.

According to another example, XH is a primary amine group and the polycondensation is carried out in the presence of a Lewis acid added as a catalyst. The Lewis acid catalyst may promote the polycondensation of a second monomeric unit of Formula III with a squarate ester e.g. diethoxy-3-cyclobutene-1,2-dione (or diethyl squarate) by suppressing the formation of squaraine byproducts. The byproduct of the Lewis acid promoted polycondensation is an alcohol such as ethanol. Non-limiting examples of Lewis acid catalysts include boron trifluoride etherate ($BF_3 \cdot OEt_2$), tin tetrachloride ($SnCl_4$), zinc chloride ($ZnCl_2$), and metal trifluoromethanesulfonates (triflates). Non-limiting examples of metal trifluoromethanesulfonates include scandium(III) trifluoromethanesulfonate ($Sc(OTf)_3$), magnesium trifluoromethanesulfonate ($Mg(OTf)_2$), cupric trifluoromethanesulfonate ($Cu(OTf)_2$) and zinc trifluoromethanesulfonate ($Zn(OTf)_2$). For example, the Lewis acid is zinc trifluoromethanesulfonate (zinc triflate).

According to one example, Lewis acid having promoted polycondensation is carried out in the presence of a mixture of an organic polar aprotic solvent and a nonpolar solvent. For example, the solvent comprises toluene and dimethylformamide.

Alternatively, the polymerization may also be accomplished by an organometallic chemical reaction such as the Grignard reaction. For instance, the polymerization of the monomers by coupling a Grignard reagent with an aryl halide. For example, the Grignard reagent is prepared by the reaction of the repeated monomeric units derived from squaric acid of Formula II, in which the leaving group is a halogen atom, with magnesium. For instance, the leaving group is in each occurrence a halogen atom independently and in each occurrence selected from the group consisting of chlorides, bromides, iodides, preferably a chlorine atom.

The polymer is then produced by the subsequent reaction of said prepared Grignard reagent and monomer units derived from a squaric acid of Formula II or monomeric units of Formula IV respectively to produce a homopolymer and a copolymer. When the polymer is a copolymer, it may be prepared by a polymerization process as illustrated in Scheme 3:

Scheme 3

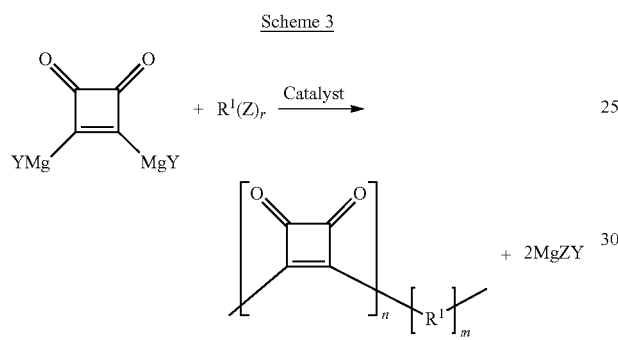

When the polymer is a homopolymer, it may be prepared by a polymerization process as illustrated in Scheme 4:

Scheme 4

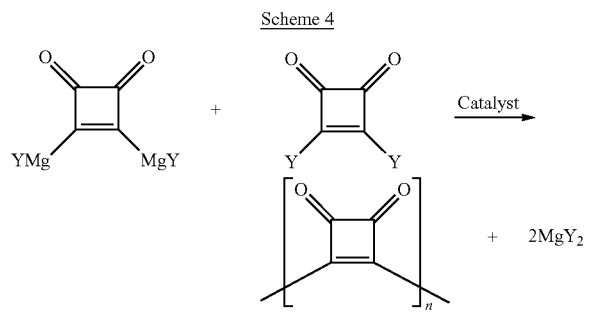

According to one example, the Grignard reaction is carried out in the presence of a catalyst. For example, the catalyst comprises a transition metal or a compound comprising a transition metal. For instance, the transition metal is selected from the group consisting of nickel, palladium, cobalt, iron, chromium, copper and manganese, preferably, nickel or palladium. For instance, the catalyst may be a complex. For example, a complex comprising triphenylphosphine ($PPh_3$) or 2,2'-bipyridine (bpy). Non-limiting examples of catalysts include $NiCl_2(bpy)$, $NiBr_2(PPh_3)_2$, $PdCl_2(bpy)$, $Pd_2(dba)_3$, $Pd(PPh_3)_4$, $Pd(PPh_3)_2Cl_2$, $FeEt_2(bpy)_2$, $CrMeCl_2(THF)_3$, bis (1,5-cyclooctadiene) nickel (Ni(COD)$_2$) $(PPh_3)_2$, $FeCl_2$, $FeCl_3$ and $CoCl_2$. For instance, the catalyst comprises a complex of $Ni(COD)_2$ and $PPh_3$ in a 1:2 ratio.

According to one example, the Grignard reaction is carried out in the presence of an organic polar aprotic solvent. For example, the organic polar aprotic solvent may be tetrahydrofuran (THF).

Alternatively, the polymerization may be accomplished by a dehalogenation polymerization of halo aromatic compounds or by cross-coupling of a halo aromatic compound with an activated compound such as a tralkyltin compound or a boronic acid or boronic acid ester compound. The dehalogenation polymerization is the reaction of the repeated monomeric units derived from squaric acid of Formula II in which the leaving group is a halogen atom with halo aromatic compounds. For example, the halo aromatic compound may be a di- or poly-halogenated aromatic compound. For instance, the halo aromatic compound is of Formula IV. For instance, the halogen atom is independently and, in each occurrence, selected from the group consisting of Cl, Br and I, preferably a Cl or Br. Similarly, the cross-coupling may be accomplished by reacting repeated monomeric units derived from squaric acid of Formula II in which the leaving group is a halogen atom with aromatic compounds comprising tralkyltin, boronic acid or boronic acid ester moieties, for instance, the monomeric unit of Formula IV wherein Z is a tralkyltin, boronic acid or boronic acid ester group. For example, the aromatic compound is derived from a benzene or heteroaromatic group. When the polymer is a copolymer, it may be prepared by a polymerization process as illustrated in Scheme 5:

Scheme 5

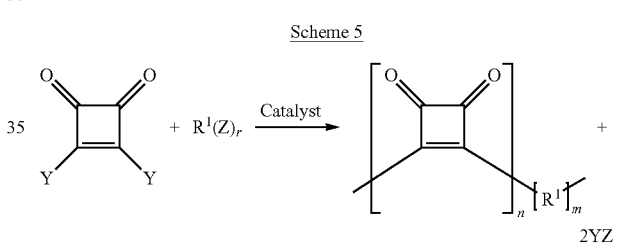

Non-limiting examples of aromatic compounds of Formula IV comprise the compounds of Formulae IV(j), IV(k), IV(l), IV(m), IV(n), IV(o) or IV(p). For instance, the aromatic compound is selected from the group consisting of p-dibromobenzene, p-dichlorobenzene, m-dichlorobenzene, m-dibromobenzene, o,p-dichlorotoluene, 2,5-dibromopyridine, 9,10-dibromoanthracene, 1,3,5-trichlorobenzene, 2,5-dibromothiophene, thiophene-2,5-diboronic acid, thiophene-2,5-diboronic acid ester (e.g. a bis(pinacol) ester), 2,5-bis(trialkyltin)thiophene (e.g. 2,5-bis(n-butyltin)thiophene).

According to one example, the polymerization with aromatic compounds may be carried out in the presence of a catalyst. For example, the catalyst is in excess when compared to the monomers. For example, the catalyst comprises a transition metal or a compound comprising a transition metal. For instance, the transition metal is selected from the group consisting of Ni, Pd, Co, Fe, Cr, Co and Mn, preferably, Ni or Pd. For instance, the catalyst may be complexes. For example, complexes comprising triphenylphosphine ($PPh_3$) or 2,2'-bipyridine (bpy). Examples of catalysts also include $NiCl_2(bpy)$, $NiBr_2(PPh_3)_2$, $PdCl_2(bpy)$, $Pd_2(dba)_3$, $Pd(PPh_3)_4$, $Pd(PPh_3)_2Cl_2$, $FeEt_2(bpy)_2$, $CrMeCl_2(THF)_3$, and bis (1,5-cyclooctadiene) nickel (Ni(COD)$_2$) $(PPh_3)_2$. For instance, the catalyst may be generated in situ. For instance, the catalyst comprises $Ni(COD)_2$, 1,5-cyclooctadiene and bpy catalyst in a 1:1:1 ratio. For instance, the catalyst may further comprise a trialkylphosphine or triphenylphosphine (PPh₃), tetrahydrofuran (THF), 2,2'-bipyridine (bpy), CuI or KF. In some instances, the reaction may proceed in an ionic liquid without an additional catalyst, for instance when Z is a boronic ester. Polymerization methods using ionic liquids are illustrated in Page, Z. A. et al., *Chem. Sci.*, 2014, Vol. 5, 2368-73.

According to one example, the polymerization with aromatic compounds is carried out in the presence of a nonpolar solvent. For example, the nonpolar solvent may be toluene.

The process as described herein may be considered a cheaper and easier to scale-up polymerization process compared to other existing processes. The polymerization process as described herein is also much safer than the process presented by Neuse, E. W. et al. (see above). For example, the process as described herein avoids the use of hot polyphosphoric acid. Other advantages include the possibility of designing the polymer in terms of the monomers used during the copolymerization with squaric acid; this versatility makes voltage tuning possible by varying the reaction conditions and monomers used.

The polymers obtainable by a process as herein described, including any combination of squaric acid-derived monomers and any of the second monomers are also contemplated. Non-limiting examples of the present polymers include:

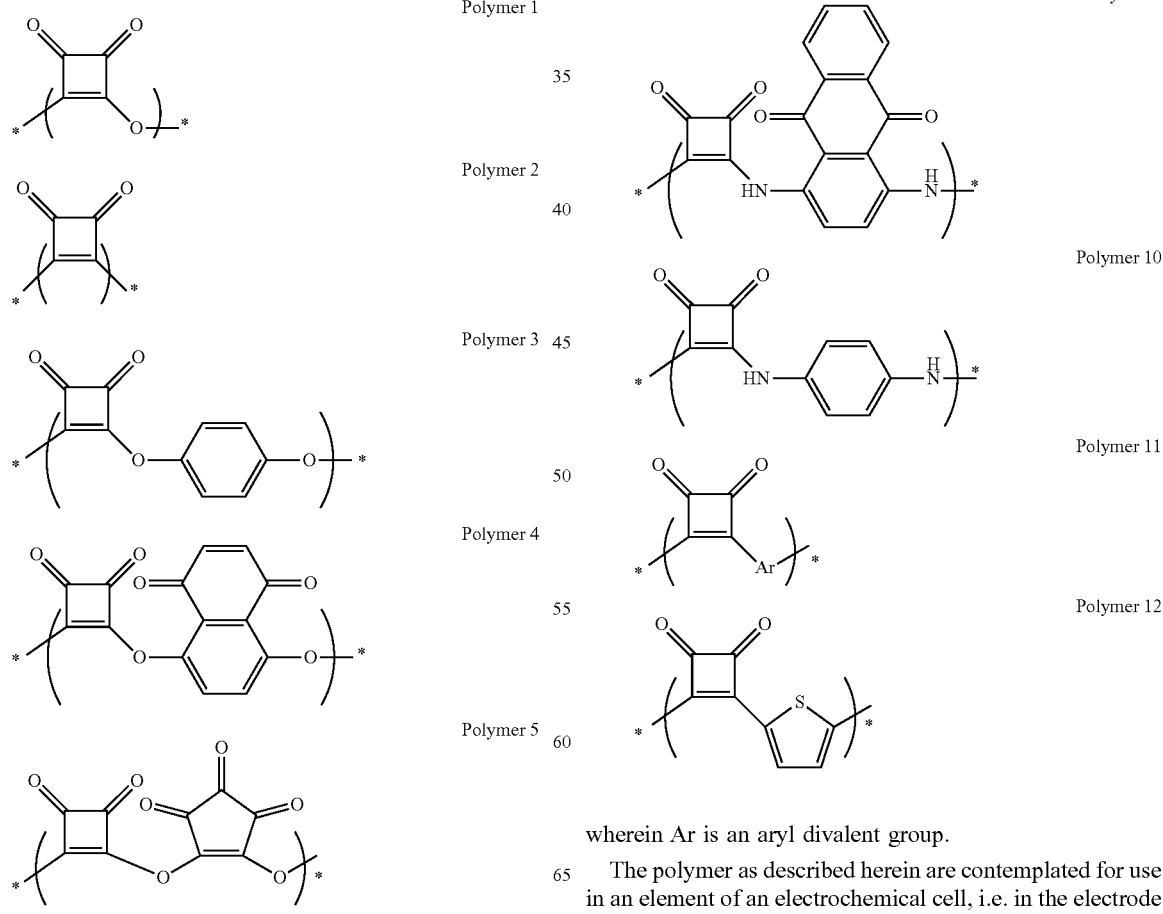

wherein Ar is an aryl divalent group.

The polymer as described herein are contemplated for use in an element of an electrochemical cell, i.e. in the electrode material and/or in the electrolyte composition.

According to another aspect, the present technology also relates to an electrode material comprising a polymer as defined herein. In one variant of interest, the electrode material is a positive electrode material. In one embodiment, the positive electrode material comprises an electrochemically active material, optionally a binder, optionally additives, optionally an electronically conductive material, or a combination thereof.

The electrode material may also optionally include additional components like conductive materials, salts, inorganic particles, glass or ceramic particles, and the like. Examples of conductive materials include carbon black, Ketjen™ black, acetylene black, graphite, graphene, carbon fibers, nanofibers (for example: VGCF) or carbon nanotubes, or a combination thereof.

In one example, the polymer as described herein is used as a binder in an electrode material. Alternatively, the polymer is used as an electrochemically active material. The polymer may also act as both a binder and an electrochemically active material in an electrode material.

In one example, the polymer as described herein is grafted on an electrochemically active. For instance, the electrochemically active material is selected from the group consisting of metal oxide particles, lithiated metal oxide particles, metal phosphate particles and lithiated metal phosphate particles. For instance, the metal is a transition metal selected from the group consisting of titanium (Ti), iron (Fe), manganese (Mn), vanadium (V), nickel (Ni), cobalt (Co) and a combination of at least two thereof.

In another example, the electrochemically active electrode material may further comprise an oxide of a transition metal, for instance, the transition metal is selected from the group consisting of titanium (Ti), manganese (Mn), cobalt (Co), and the like. According to another aspect, the present technology also relates to a positive electrode comprising the electrode material as herein defined. For instance, the positive electrode comprises the electrode material on a current collector. The present technology also contemplates an electrolyte composition comprising a polymer as defined herein and a salt. For instance, the electrolyte may be a gel or solid polymer electrolyte. Where the electrolyte is a gel electrolyte, a separator may be further added.

According to another aspect, the present technology also relates to electrochemical cells comprising the present polymer. Such electrochemical cells comprise a negative electrode, a positive electrode and an electrolyte, wherein at least one of the positive electrodes and electrolyte comprises the present polymer. In one example, the positive electrode comprises an electrode material as herein defined. In another example, the electrolyte comprises an electrolyte composition as herein defined. In another example, the electrode comprises an electrode material as herein defined, and the electrolyte comprises an electrolyte composition as herein defined.

For more clarity, the electrochemically active material of the negative electrode may be selected from any known material, including the electrochemically active material (selected for redox compatibility with the electrode active material) defined above, as well as alkali metal films; for example, metallic lithium film or an alloy thereof. In one example, the negative electrode material does not include the present polymer; but rather, it consists of a film of metallic material or a negative electrode material on a current collector. For example, if the negative electrode material is lithium metal or a lithium insertion material, or the negative electrode material is a film of metallic lithium.

According to another aspect, a battery comprising at least one electrochemical cell as defined herein is described. For example, the battery is selected from the group consisting of a lithium battery, a sodium battery and a magnesium battery.

According to another aspect, the polymers described herein are contemplated for use in polymer-based optoelectronic devices, such as electrochromic devices (ECDs), photochromic devices, organic light-emitting diode (OLEDs) and solar cells.

EXAMPLES

The following non-limiting examples are illustrative embodiments and should not be construed as further limiting the scope of the present invention. These examples will be better understood with reference to the accompanying Figures.

Example 1: Preparation of Homopolymers (a) Polycondensation of Squaric Acid with Squaryl Dichloride—Synthesis of the Squaric Acid-Based Homopolymer (Poly(Squaric Ester))

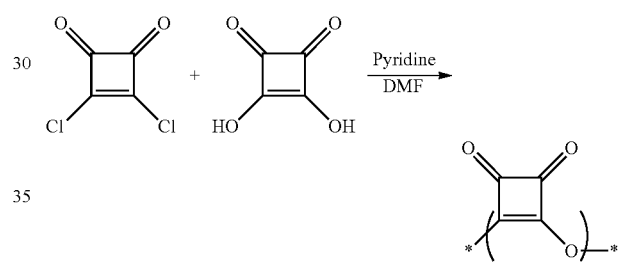

This example illustrates the polycondensation of squaric acid and squaryl dichloride (1,2-dichlorocyclobutene-3,4-dione). To perform this polycondensation, 1 g of squaric dichloride and 0.75 g of squaric acid were introduced into a 200 mL Schlenk flask. 30 mL of dry dimethylformamide (DMF) and 10 mL of dry pyridine as a hydrogen chloride acceptor were added into the Schlenk flask under inert atmosphere. The reaction was then stirred with a magnetic bar at room temperature for three days. The solvent was then removed using a rotary evaporator. Water (100 mL) was then added to the obtained residue and the resulting slurry was vigorously stirred for 15 minutes. The solid was filtered and washed with water (5 times), followed by methanol (5 times) and toluene (5 times) until the filtrate became clear. The solid was then dried under vacuum at 60° C. for 12 hours.

(b) Homo Polymerization of Squaryl Dichloride—Synthesis of a Squaric Acid-Based Homopolymer

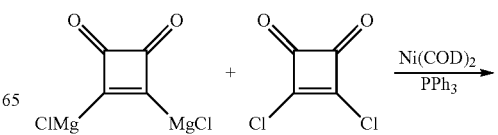

-continued

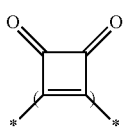

Preparation of a Grignard Reagent Solution 30 mL anhydrous tetrahydrofuran (THF) is added to a three-neck round-bottom flask anhydrous reactor purged with nitrogen (N₂), (0.322 g, 13.2 mmol) of freshly etched dried magnesium turnings is added to the reactor and the resulting suspension is purged with N₂. A solution of (1.00 g, 6.62 mmol) of 3,4-dichloro-3-cyclobutene-1,2-dione in 10 mL of anhydrous THF is prepared and then added progressively over an hour in the reactor to magnesium turnings suspension using a cannula under N₂ atmosphere. The resulting Grignard reagent solution is then heated at 70° C. under reflux for an hour and then cooled down to room temperature and degassed under N₂ atmosphere.

Preparation of a Squaryl Dichloride Solution 10 mL anhydrous tetrahydrofuran (THF) is added to a second three-neck round-bottom flask anhydrous reactor purged with nitrogen (N₂), (1.00 g, 6.62 mmol) of 3,4-dichloro-3-cyclobutene-1,2-dione is added to the second reactor and the resulting solution is then degassed using N₂. (0.09 g, 0.331 mmol) of bis(1,5-cyclooctadiene) nickel (Ni(COD)₂) and (0.173 g, 0.662 mmol) of triphenylphosphine (PPh₃) is then added to the resulting solution and the reactor is purged with N₂.

Preparation of the Polymer

The Grignard reagent solution prepared in the first step is added to the squaryl dichloride solution prepared in the second step using a cannula under N₂ atmosphere. The resulting solution is then heated to about 70° C. under reflux for 16 hours. The reaction is then precipitated in a 10:1 v/v solution of methanol and water and the polymer is recovered by filtration.

(c) Homo Polymerization of Squaryl Dichloride—Synthesis of a Squaric Acid-Based Homopolymer

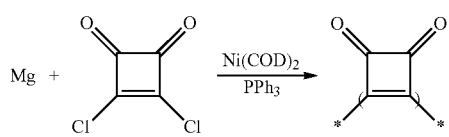

Preparation of a Grignard Reagent Solution 30 mL of anhydrous tetrahydrofuran (THF) is added to a three-neck round-bottom flask anhydrous reactor purged with nitrogen (N₂), (0.161 g, 6.62 mmol) of freshly etched dried magnesium turnings is added to the reactor and the resulting suspension is purged with N₂. A solution of (1.00 g, 6.62 mmol) of 3,4-dichloro-3-cyclobutene-1,2-dione in 10 mL in anhydrous THF is prepared and then added progressively over an hour in the reactor to magnesium turnings suspension using a cannula under N₂ atmosphere. The resulting Grignard reagent solution is then heated at 70° C. under reflux for an hour and then cooled down to room temperature and degassed under N₂ atmosphere.

Preparation of a Ni(COD)₂ Solution 10 mL of anhydrous THF is added to a second three-neck round-bottom flask anhydrous reactor purged with N₂ and degassed with N₂. (0.09 g, 0.331 mmol) of bis(1,5-cyclooctadiene) nickel (Ni(COD)₂) and (0.173 g, 0.662 mmol) of triphenylphosphine (PPh₃) is then added to the THF and the reactor is purged with N₂.

Preparation of the Polymer

The Grignard reagent solution prepared in the first step is added to the Ni(COD)₂ solution prepared in the second step using a cannula under N₂ atmosphere. The resulting solution is then heated at 70° C. under reflux for 16 hours. The reaction is then precipitated in a 10:1 v/v solution of methanol and water and the polymer is recovered by filtration.

(d) Homo Polymerization of Squaryl Dichloride—Synthesis of a Squaric Acid-Based Homopolymer

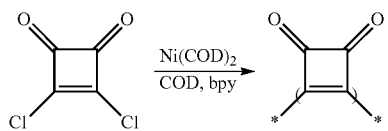

Ni(COD)₂ (1 eq.), 1,5-cyclooctadiene (1 eq.), and 2,2'-bipyridine (bpy) (1 eq.) are dissolved in toluene. 3,4-dichloro-3-cyclobutene-1,2-dione (0.03 eq.) is added to the mixture. The reaction is then stirred at 60° C. for 96 hours to result in an insoluble polymer. The precipitate is then washed with an aqueous solution of ammonia, with an aqueous solution of ethylenediaminetetraacetic acid disodium salt solution (EDTA disodium salt) at room temperature and then with water at a temperature of 50° C. The resulting polymer is washed by extraction with chloroform using a Soxhlet overnight and then extracted with methanol and filtered on Celite™. Methanol is removed by evaporation to afford the title polymer.

Example 2: Preparation of Copolymers (a) Polycondensation of Benzene-1,4-Diol with Squaryl Dichloride—Synthesis of a Poly(Squaric-Alt-p-Dihydroxyphenylene) Copolymer

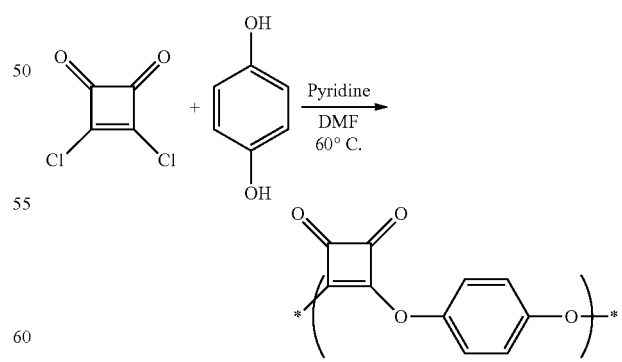

This example illustrates the polycondensation of hydroquinone and squaryl dichloride. To perform this polycondensation, 0.88 g of 3,4-dichloro-3-cyclobutene-1,2-dione (squaryl dichloride) and 0.50 g of benzene-1,4-diol were introduced into a 200 mL Schlenk flask. 30 mL of dry dimethylformamide (DMF) and 10 mL of dry pyridine as a hydrogen chloride acceptor were added into the Schlenk flask under inert atmosphere. The reaction was then stirred with a magnetic bar at a temperature of 60° C. for 48 hours. The solvent was then removed using a rotary evaporator. Water (100 mL) was added to the obtained residue and the resulting slurry was vigorously stirred for 15 minutes. The solid was filtered and washed with water (5 times), followed by methanol (5 times) and toluene (5 times) until the filtrate became clear. The solid was then dried under vacuum at 60° C. for 12 hours.

(b) Polycondensation of 5,8-Dihydroxy-1,4-Naphthoquinone with Squaryl Dichloride—Synthesis of a Poly(Squaric-Alt-Naphthazarin)

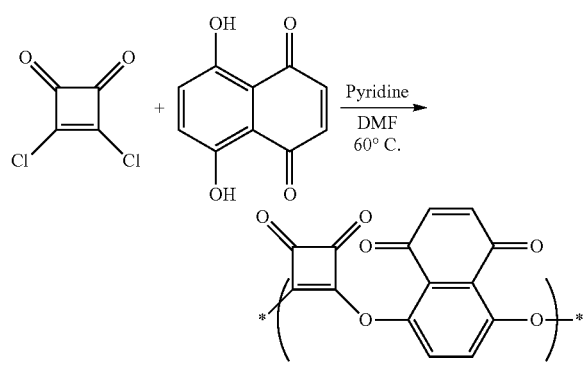

This example illustrates the polycondensation of 5,8-dihydroxy-1,4-naphthoquinone (naphthazarin) and squaryl dichloride. To perform this polycondensation, 0.40 g of 3,4-dichloro-3-cyclobutene-1,2-dione (squaric dichloride) and 0.50 g of 5,8-dihydroxy-1,4-naphthoquinone were introduced into a 200 mL Schlenk flask. 30 mL of dry dimethylformamide (DMF) and 10 mL of dry pyridine as a hydrogen chloride acceptor were added into the Schlenk flask under inert atmosphere. The reaction was then stirred with a magnetic bar at a temperature of 60° C. for 48 hours. The solvent was then removed using a rotary evaporator. Water (100 mL) was added to the obtained residue and the resulting slurry was vigorously stirred for 15 minutes. The solid was filtered and washed with water (5 times), followed by methanol (5 times) and toluene (5 times) until the filtrate became clear. The solid was then dried under vacuum at 60° C. for 12 hours.

(c) Polycondensation of 4,5-Dihydroxycyclopent-4-Ene-1,2,3-Trione with Squaryl Dichloride—Synthesis of a Poly(Squaric-Alt-4,5-Dihydroxycyclopent-4-Ene-1,2,3-Trione)

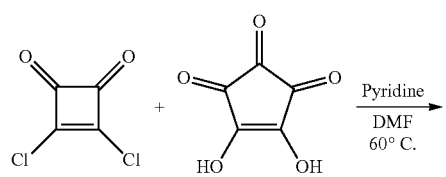

-continued

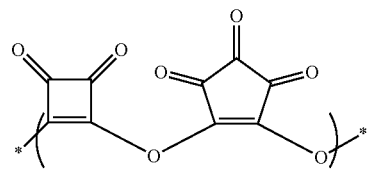

This example illustrates the polycondensation of croconic acid and squaryl dichloride. To perform this polycondensation, 0.53 g of 3,4-dichloro-3-cyclobutene-1,2-dione (squaric dichloride) and 0.50 g of 4,5-dihydroxycyclopent-4-ene-1,2,3-trione were introduced into a 200 mL Schlenk flask. 30 mL of dry dimethylformamide (DMF) and 10 mL of dry pyridine as a hydrogen chloride acceptor were added into the Schlenk flask under inert atmosphere. The reaction was then stirred with a magnetic bar at a temperature of 60° C. for 48 hours. The solvent was then removed using a rotary evaporator. Water (100 mL) was added to the obtained residue and the resulting slurry was vigorously stirred for 15 minutes. The solid was filtered and washed with water (5 times), followed by methanol (5 times) and toluene (5 times) until the filtrate became clear. The solid was then dried under vacuum at 60° C. for 12 hours.

(d) Polycondensation of 5,6-Dihydroxycyclohex-5-Ene-1,2,3,4-Tetrone with Squaryl Dichloride—Synthesis of a Poly(Squaric-Alt-5,6-Dihydroxycyclohex-5-Ene-1,2,3,4-Tetrone)

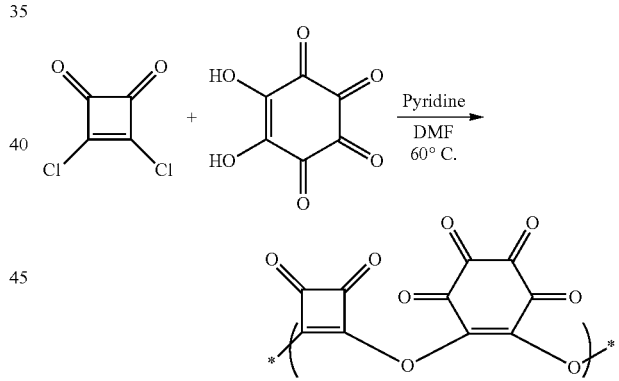

This example illustrates the polycondensation of rhodizonic acid, and squaryl dichloride. To perform this polycondensation, 0.44 g of 3,4-dichloro-3-cyclobutene-1,2-dione (squaric dichloride) and 0.50 g of 5,6-dihydroxycyclohex-5-ene-1,2,3,4-tetrone were introduced into a 200 mL Schlenk flask. 30 mL of dry dimethylformamide (DMF) and 10 mL of dry pyridine as a hydrogen chloride acceptor were added into the Schlenk flask under inert atmosphere. The reaction was then stirred with a magnetic bar at a temperature of 60° C. for 48 hours. The solvent was then removed using a rotary evaporator. Water (100 mL) was added to the obtained residue and the resulting slurry was vigorously stirred for 15 minutes. The solid was filtered and washed with water (5 times), followed by methanol (5 times) and toluene (5 times) until the filtrate became clear. The solid was then dried under vacuum at 60° C. for 12 hours.

(e) Polycondensation of Tetrahydroxy-1,4-Benzoquinone with Squaryl Dichloride—Synthesis of a Poly(Squaric-Alt-Tetrahydroxy-1,4-Benzoquinone)

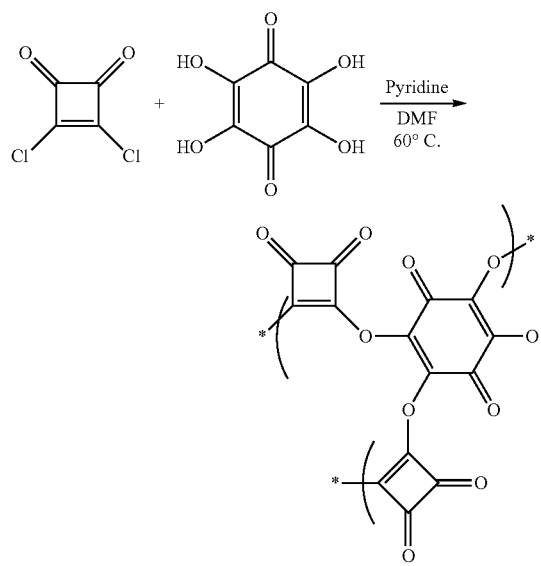

This example illustrates the polycondensation of tetrahydroxy-1,4-benzoquinone, and squaryl dichloride. To perform this polycondensation, 0.44 g of 3,4-dichloro-3-cyclobutene-1,2-dione (squaric dichloride) and 0.50 g of tetrahydroxy-1,4-benzoquinone were introduced into a 200 mL Schlenk flask. 30 mL of dry dimethylformamide (DMF) and 10 mL of dry pyridine as a hydrogen chloride acceptor were added into the Schlenk flask under inert atmosphere. The reaction was then stirred with a magnetic bar at a temperature of 60° C. for 48 hours. The solvent was removed using a rotary evaporator. Water (100 mL) was added to the obtained residue and the resulting slurry was vigorously stirred for 15 minutes. The resulting solid was filtered and washed with water (5 times), followed by methanol (5 times) and toluene (5 times) until the filtrate became clear. The solid was then dried under vacuum at 60° C. for 12 hours.

The copolymer described in this example was characterized by attenuated total reflectance Fourier transform infrared spectroscopy (ATR-FTIR) and the resulting spectrum is shown in FIG. 1.

(f) Polycondensation of 1,4-Diaminoanthraquinone with Squaryl Dichloride—Synthesis of a Poly(Squaric Amide)

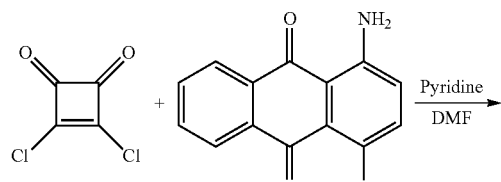

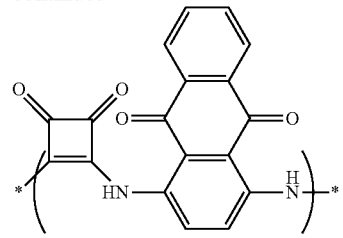

This example illustrates the polycondensation of 1,4-diaminoanthraquinone and squaryl dichloride. To perform this polycondensation, 1.3 g of squaric dichloride and 2.29 g of 1,4-diaminoanthraquinone were introduced into a 200 mL Schlenk flask. 100 mL of dry dimethylformamide (DMF) and 25 mL of dry pyridine as a hydrogen chloride acceptor were added into the Schlenk flask under inert atmosphere. The reaction was then stirred with a magnetic bar at room temperature for three days. The solvent was then removed using a rotary evaporator. Water (100 mL) was then added to the obtained residue and the resulting slurry was vigorously stirred for 15 minutes. The solid was filtered and washed with water (5 times), followed by methanol (5 times) and toluene (5 times) until the filtrate became clear. The solid was then dried under vacuum at 60° C. for 12 hours.

Figure 2:
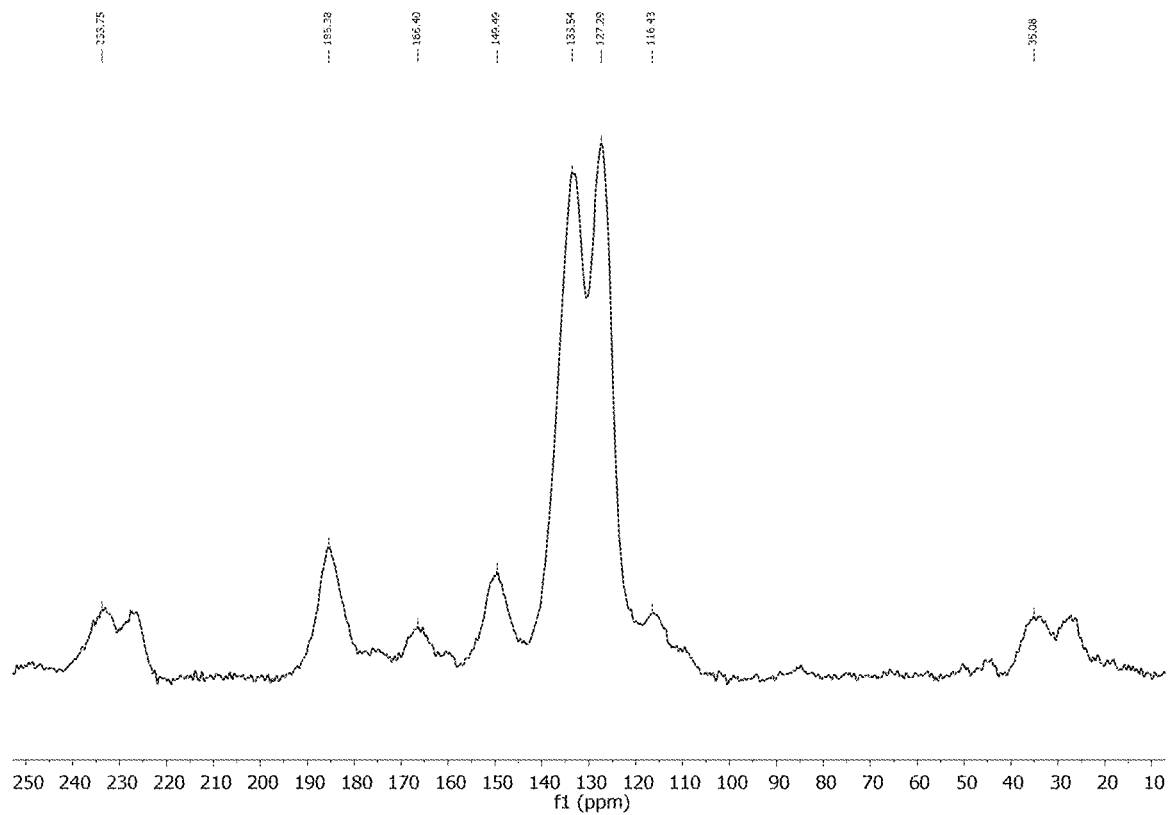
FIG. 2 displays a solid state 13C nuclear magnetic resonance (NMR) spectrum of a copolymer according to one embodiment, as described in Example 2(f).
Figure 3:
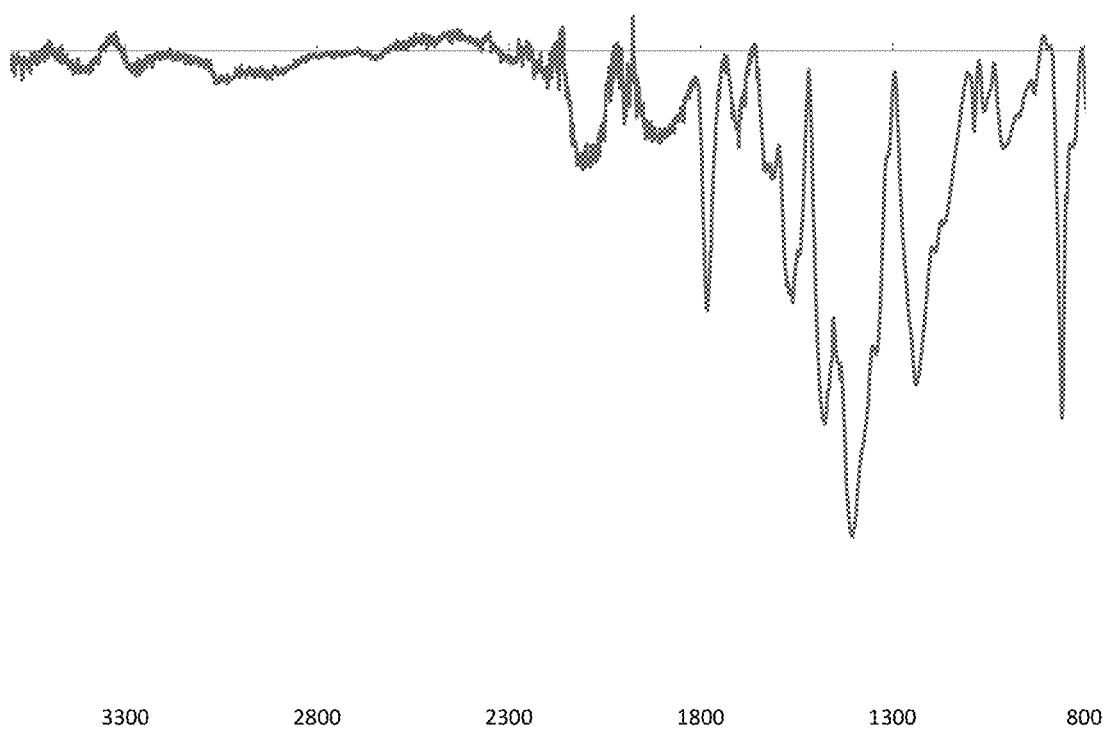
FIG. 3 displays a ATR-FTIR spectrum of a copolymer according to one embodiment, as described in Example 2(f).
Figure 4:
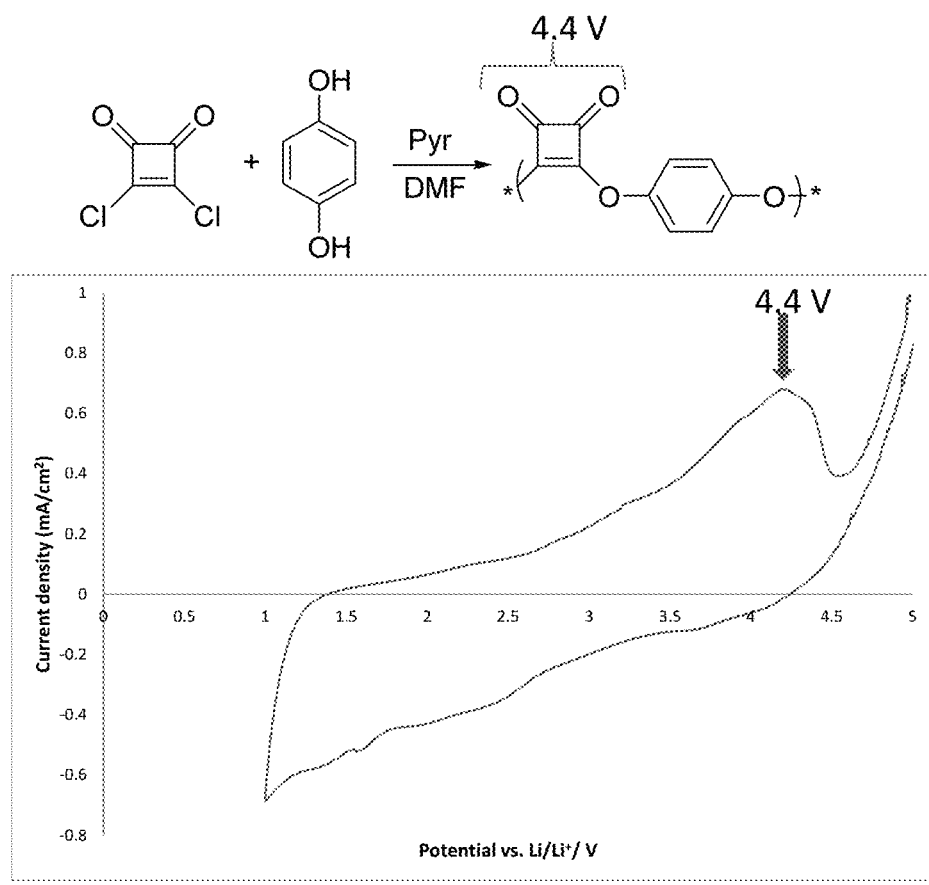
FIG. 4 displays a cyclic voltammogram of a copolymer according to one embodiment, as described in Example 3(a).
Figure 5:
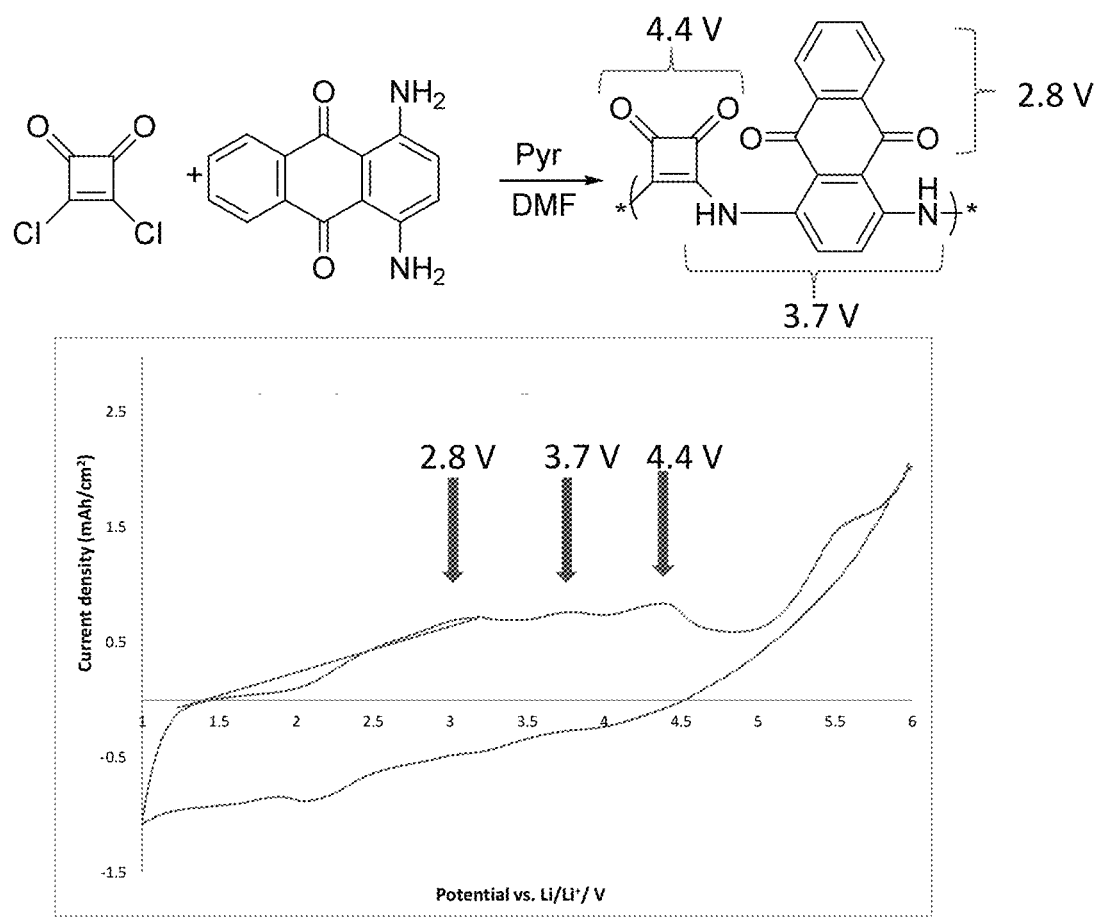
FIG. 5 displays a cyclic voltammogram of a copolymer according to one embodiment, as described in Example 3(b).

The copolymer was characterized by $^{13}C$ solid-state nuclear magnetic resonance (NMR) spectroscopy (FIG. 2) and by ATR-FTIR (FIG. 3).

(g) Polycondensation of p-Phenylenediamine (PPD) with Diethyl Squarate—Synthesis of a Poly(Squaric Amide)

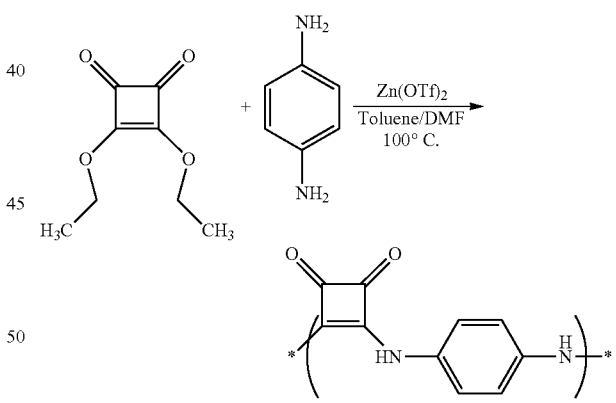

0.64 g of p-phenylenediamine (PPD) was added to 10 mL of a stirred solution comprising 1.0 g of diethoxy-3-cyclobutene-1,2-dione (or diethyl squarate) and 428 mg of zinc trifluoromethanesulfonate (zinc triflate) in a solvent comprising toluene and dimethylformamide 9:1. The reaction was then stirred with a magnetic bar at a temperature of 100° C. for three 12 hours. The solvent was then removed using a rotary evaporator. Water (100 mL) was then added to the obtained residue and the resulting slurry was vigorously stirred for 15 minutes. The solid was filtered and washed with water (5 times), followed by methanol (5 times) and toluene (5 times) until the filtrate became clear. The solid was then dried under vacuum at 60° C. for 12 hours.

(h) Copolymerization with Halo Aromatic Compounds—Synthesis of the Squaric Aryl Copolymer

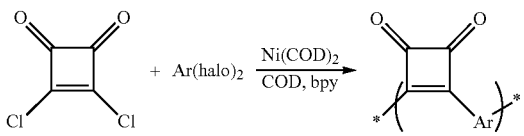

0.3 equivalents of 3,4-dichloro-3-cyclobutene-1,2-dione and 0.3 equivalents an aromatic dibromide or an aromatic dichloride with respect to a catalyst formed in situ by adding 0.83 g of $Ni(COD)_2$, 0.35 g of 1,5-cyclooctadiene, and 0.47 g of 2,2'-bipyridine (bpy) in toluene. The reaction is then stirred at 60° C. for 96 hours to result in an insoluble polymer. The precipitate is then washed with an aqueous solution of ammonia, and with an aqueous solution of ethylenediaminetetraacetic acid disodium salt solution (EDTA disodium salt) at room temperature and then with water at a temperature of 50° C. The resulting polymer is then dried under vacuum at 60° C. for 48 hours. In one example, the aromatic dibromide is 2,5-dibromothiophene.

(i) Copolymerization with Aromatic Boronic Acid Ester Compounds—Synthesis of Squaric Thiophene Copolymer

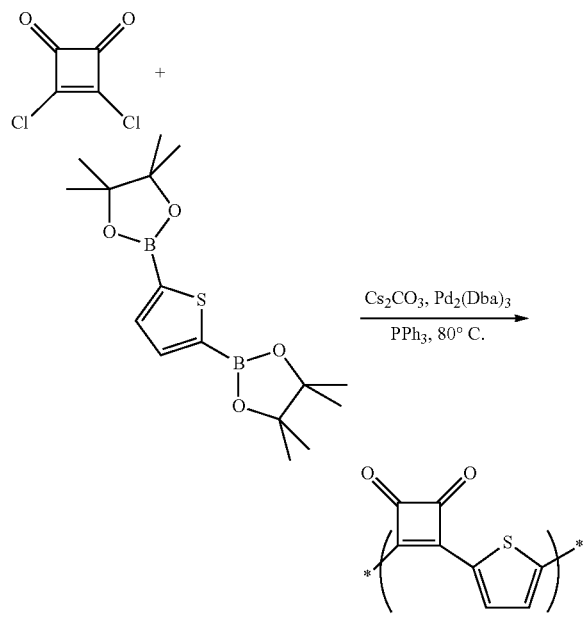

Preparation of Thiophene-2,5-Diboronic Acid Bis(Pinacol) Ester

The bis-pinacol boronic ester is prepared according to a Miyaura reaction. In a glovebox, anhydrous acetonitrile (45 mL), 2,5-dibromothiophene (0.7 mL) are introduced in a 100 mL Schlenk flask followed by bis(pinacolato)diboron (3.14 g), $Pd_2(Dba)_3$ (0,639 g), $P(Ph)_3$ (0.647 g), and potassium acetate (1.85 g) equipped with a septum. The Schlenk flask in removed from the glovebox while kept closed and under argon. The reaction mixture is then stirred at 55° C. for 24 h. Ethyl acetate (70 mL) is added and the mixture is filtered on Celite™. The filtrate is then washed three times with water and five times a 20% $Na_2S_2O_3$ aqueous solution, followed by a 67% solution if the washing solution is still red. The mixture is then dried over $MgSO_4$ and filtered. The filtrate is concentrated in a rotary evaporator under vacuum at 77° C. The mixture is then passed through silica gel using a hexane/ethyl acetate 80/20 mixture followed by a 60/40 mixture. The solution obtained is then concentrated in vacuo to afford the product. The chemical structure is confirmed by $^1H$ and $^{13}C$ NMR.

Preparation of the Copolymer 0.225 g of 3,4-dichloro-3-cyclobutene-1,2-dione, 0.5 g of thiophene-2,5-diboronic acid bis(pinacol) ester and cesium carbonate are introduced into a Schlenk flask. The solvent (e.g. toluene) is added followed by $Pd_2(Dba)_3$ and $P(Ph)_3$. The reaction mixture is then stirred at 80° C. for 4 days. A solution of methanol and hydrochloric acid (8:1) is added and stirred during 20 min. The mixture is filtered on a Büchner and washed with methanol. The product is then dried in an oven at 80° C. for 1 day.

(j) Copolymerization with Trialkyltin Aromatic Compounds—Synthesis of Squaric Thiophene Copolymer

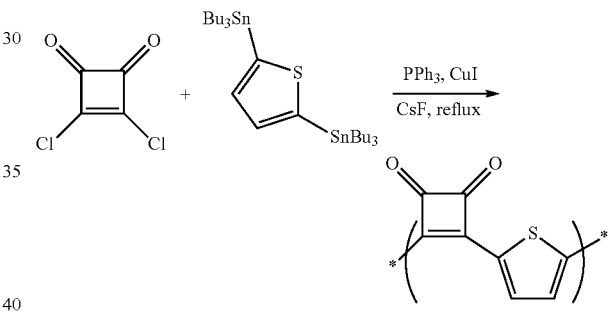

The cross-coupling polymerization reaction may also proceed via a Stille coupling. Under inert atmosphere, 2,5-bis(tributylstannyl)thiophene and 3,4-dichloro-3-cyclobutene-1,2-dione are added to a Schlenk flask and dissolved in toluene. The resulting solution is degassed. $Pd(PPh_3)_4$ (0.1 eq.) and CuI (0.2 eq.) are added and the solution is stirred for a few minutes. CsF (4.4 eq.) is then added and the reaction is heated to reflux until completion as monitored by thin-layer chromatography (TLC). After cooling down, the mixture is concentrated in vacuo, the residue is dissolved in a minimum of dichloromethane, precipitated and submitted to purification.

Example 3: Electrochemical Properties—Cyclic Voltammetry (a) Electrochemical Properties of Poly(Squaric Ester)

FIG. 1 displays a cyclic voltammogram recorded with the copolymer prepared according to the procedure of Example 2(a) using lithium metal as a counter-electrode and 1 M lithium hexafluorophosphate ($LiPF_6$) in a carbonate solvent as an electrolyte. The results are presented at a speed of 2 mV/s, at room temperature and potential swept between 1 and 5 V (vs Li/Li+). The reaction between the squaric unit and lithium (lithium insertion) was observed at a high voltage of 4.2 V. This polymer thus allows for cycling of the battery at a high voltage (i.e. higher than 3.8 V). A specific capacity of 96 mAh/g was calculated using the area under the cyclic voltammogram curve.

(b) Electrochemical Properties of Poly(Squaric Amide)

FIG. 2 displays a cyclic voltammogram recorded with the copolymer prepared according to the procedure of Example 2(f) using lithium metal as a counter-electrode and 1 M lithium hexafluorophosphate (LiPF$_6$) in a carbonate solvent as an electrolyte. The results are presented at a speed of 2 mV/s, at room temperature and the potential swept between 1 and 6 V (vs Li/Li+). FIG. 2 displays three lithium insertion peaks; one may be attributed to the quinone moiety (2.8 V), the second may be attributed to the 1,4-diaminophenyl moiety of the 1,4-diaminoanthraquinone (3.7 V) and the last one may be attributed to the squaric unit (4.4 V).

A specific capacity of 692 mAh/g was calculated using the area under the cyclic voltammogram curve.

Aside from the insertion of lithium at a high voltage (up to 4.4 V in this example), another benefit from this polymer is that it can be designed according to the monomers used during the copolymerization with squaric acid; this versatility allows for a tunability of reaction voltages.

Numerous modifications could be made to any of the embodiments described above without distancing from the scope of the present invention. Any references, patents or scientific literature documents referred to in the present application are incorporated herein by reference in their entirety for all purposes.

The invention claimed is:

1. An element of an electrochemical cell comprising a polymer of Formula I:

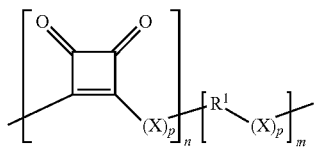

Formula I wherein,
n and m are integers representing the number of each monomeric units within the polymer, wherein n≥2 and m≥0;
X is, independently in each occurrence, selected from an oxygen atom, a sulfur atom, and an amine group of the formula NR$^x$;
p is an integer representing the number of X groups in each monomeric unit and is 0 or 1;
R$^1$ is an optionally substituted conjugated non-aromatic cyclic group, an optionally substituted aromatic or partially aromatic organic group, or a combination thereof in a polycyclic group; and
R$^x$ is a hydrogen atom or an optionally substituted alkyl.

2. The element of claim 1, wherein R$^1$ is a heterocyclic compound.

3. The element of claim 1, wherein each substituted R$^1$ is substituted with one or more substituent independently in each occurrence, selected from an alkyl group, an alkoxy group, a nitrile group, a hydroxyl group, and a halogen atom, or with a protecting group when attached to a heteroatom.

4. The element of claim 1, wherein R$^1$ is selected from the group consisting of benzene, naphthalene, anthracene, benzoquinone, naphthoquinone, and anthraquinone.

5. The element of claim 1, wherein p is 1, X is an amine group (NH) in each occurrence, and R$^1$ is selected from the group consisting of para-phenylene and anthraquinone.

6. The element of claim 1, wherein m is 0 and the polymer of Formula I is a homopolymer selected from:

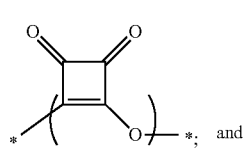

Polymer 1 and

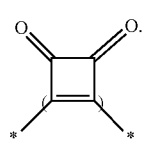

Polymer 2

7. The element of claim 1, wherein the polymer is selected from:

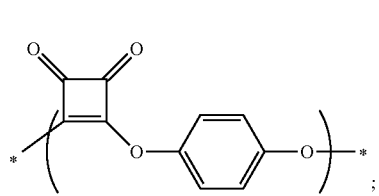

Polymer 3

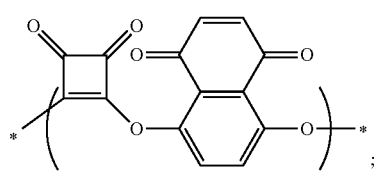

Polymer 4

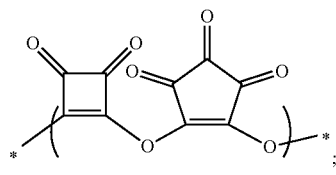

Polymer 5

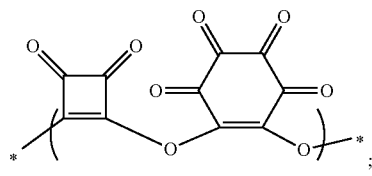

Polymer 6

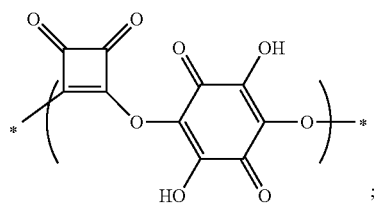

Polymer 7

Polymer 8

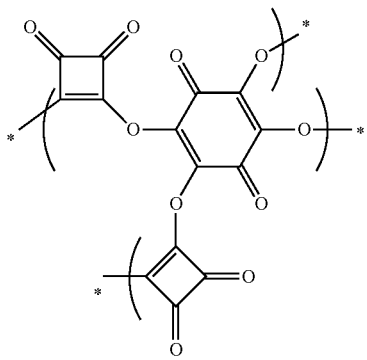

Polymer 9

Polymer 10

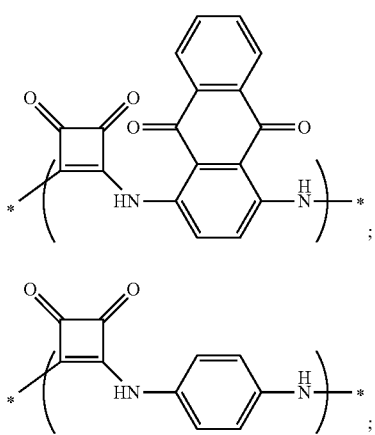

Polymer 11

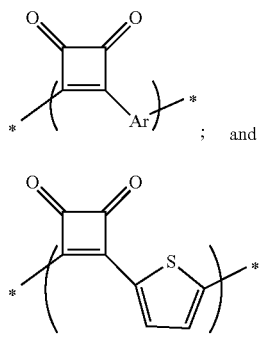
; and

Polymer 12

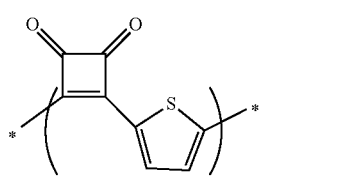

wherein Ar is an aryl divalent group.

8. The element of claim 1, wherein $R^1$ is a monocyclic or polycyclic aromatic or partially aromatic organic group.

9. The element of claim 8, wherein the monocyclic or polycyclic aromatic or partially aromatic organic group is derived from one or a plurality fused benzene rings or from one or a plurality of 5 or 6-membered fused rings or combinations thereof.

10. The element of claim 2, wherein each heterocyclic ring comprises from 1 to 3 heteroatoms selected from a N, S, and O.

11. The element of claim 10, wherein the heteroatom is N or S.

12. The element of claim 1, wherein p is 1, X is an oxygen atom in each occurrence, and $R^1$ is selected from the group consisting of benzene, naphthoquinone, cyclohex-5-ene-1,2,3,4-tetrone, cyclopentenetrione, and 1,4-benzoquinone.

13. The element of claim 1, wherein p is 0 and $R^1$ is selected from the group consisting of benzene, phenylene, pyridine, thiophene, thienopyrroledione, benzothiophene, benzothiadiazole, 3,4-ethylenedioxythiophene, carbazole, dithiopheneanthanthrone, dithiophenediketopyrrolopyrrole, isoindigo, and indigo.

* * * * *